United States Patent [19]

Ninomiya

US005646541A

[11] Patent Number: 5,646,541
[45] Date of Patent: Jul. 8, 1997

[54] APPARATUS AND METHOD FOR MEASURING CIRCUIT NETWORK

[75] Inventor: Kazuhiko Ninomiya, Hyogo, Japan

[73] Assignee: Hewlett-Packard Company, Palo Alto, Calif.

[21] Appl. No.: 408,910

[22] Filed: Mar. 22, 1995

Related U.S. Application Data

[63] Continuation-in-part of Ser. No. 262,616, Jun. 20, 1994, abandoned.

[30] Foreign Application Priority Data

Mar. 24, 1994 [JP] Japan ..................... 6-077949

[51] Int. Cl.$^6$ .............. G01R 29/22; G01R 27/28
[52] U.S. Cl. .......................... 324/727; 324/617
[58] Field of Search ....................... 324/615, 616, 324/617, 654, 727

[56] References Cited

U.S. PATENT DOCUMENTS 3,327,207  6/1967  Norwich ..................... 324/667
4,481,464  11/1984 Noguchi et al. ............... 324/650
4,816,743  3/1989  Harms et al. .................. 324/727
5,363,052  11/1994 McKee ........................ 324/663

OTHER PUBLICATIONS

Modular Crystal Test System Model MCT Data Sheet, pp. 18 and 20, Transat Corp. (date unavailable).
"Accuracy Enhancement Fundamentals—Characterizing Microwave Systematic Errors", HP 8753C Network Analyzer Operating Manual, Reference Section Appendix 2, Chap. 5, pp. 53–64 (date unavailable).

*Primary Examiner*—Kenneth A. Wieder
*Assistant Examiner*—Glenn W. Brown

[57] ABSTRACT

A circuit network measuring apparatus applies a measurement signal from a signal source to a device under test and measures circuit parameters of the device under test from the measurement signal and an output signal of the device under test. The apparatus includes a function which adds a frequency follow-up algorithm to a computer control portion to vary the output frequency of the signal source, thereby performing control such that the measured value will substantially equal a given value.

6 Claims, 8 Drawing Sheets

APPARATUS AND METHOD FOR MEASURING CIRCUIT NETWORK

This is a continuation-in-part of application Ser. No. 08/262,616 filed on 20 Jun. 1994, now abandoned.

DETAILED DESCRIPTION OF THE INVENTION

1. Field of the Invention

The present invention generally relates to an apparatus and a method for measuring circuit networks such as resonance circuits and, more particularly, to an apparatus and a method for measuring characteristics of quartz oscillators.

2. Description of the Prior Art

During a vacuum evaporation process in the manufacture of quartz oscillators, the oscillator's resonance frequency constantly changes but must be measured and adjusted to conform with a target specification. In order to manufacture highly accurate oscillators, it is necessary to accurately and quickly measure the changing resonance frequency.

Methods for measuring the resonance frequency of oscillators include (1) an oscillation method wherein an oscillator under test is incorporated into an oscillation circuit and the oscillation frequency thereof is measured and (2) a transmission method wherein the oscillation frequency is obtained from the transmission characteristics of an oscillator.

Conventional transmission methods include a frequency follow-up system and a frequency sweep system. A block diagram for the frequency follow-up system is shown in FIG. 4. A device under test 7 is placed in a vacuum evaporation chamber (not shown). A measurement signal is applied from a voltage controlled oscillator 23 through a cable 5 and connectors 3 and 6 to the input of the device under test 7. The output of the device under test 7 is applied to one of input terminals of a phase detector 25 through a cable 9 and connectors 8 and 11. The signal from the voltage controlled oscillator 23 is applied to the other input terminal of the phase detector 25 through a cable 10 and connectors 4 and 12. The length of the cable 10 is set equal to the sum of the lengths of the cables 5 and 9 connected to the device under test so that the phases of the input signals at the phase detector 25 are equal to each other when the phase lag in the device under test is 0. The phase detector 25 outputs a DC voltage whose magnitude is substantially proportionate to the phase difference between the two inputs. High frequency components which have leaked along with the DC output are removed by a filter 28 and the DC components are fed back to the voltage controlled oscillator 23 as control voltage. A feedback loop constituted by voltage controlled oscillator 23, connectors 3, 6, 8, 11, 4, and 12, cables 5, 9, and 10, device under test 7, phase detector 25, and filter 28 operates so that the phase difference between the two inputs of the phase detector 25 approaches 0 by controlling the oscillation frequency of the voltage controlled oscillator 23. In other words, it causes the frequency of the voltage controlled oscillator 23 to follow the resonance frequency of the device under test 7 which keeps changing as the evaporation proceeds. The ratio of the voltage which exits the device under test 7 to the voltage which has passed cable 10 may be measured by an amplitude detector 26 to obtain, through calculation in a computer control portion 27, transmission characteristics such as insertion loss or attenuation of device under test 7. The frequency of the voltage controlled oscillator 23, i.e., the resonance frequency of the device under test 7 is measured by a frequency counter 24 and is input to computer control portion 27 as the data for the resonance frequency.

In this conventional system, the feedback loop for frequency follow-up is constituted by an analog system. Therefore, its application is limited to simple adjustments such as maintaining a phase angle at a fixed value against changes in frequency. Further, when a highly accurate measurement is required, errors originating from the frequency characteristics of transmission systems such as cables and connectors must be eliminated. For this purpose, the feedback operation must be performed with the frequency characteristics within the feedback loop calibrated in accordance with the measurement frequency (the output frequency of the voltage controlled oscillator). However, this is not possible in the prior art. Therefore, the conventional frequency follow-up system cannot completely eliminate the influence of a transmission system having a band of several tens of MHz or more, and it is not possible to satisfy the need for measuring the resonance frequency of an oscillator at a part-per-million level.

In addition, the conventional follow-up system cannot perform simultaneous measurement on quartz oscillators having two or more resonance modes.

FIG. 4 shows a configuration wherein frequency control is carried out so that the phase angle of the device under test becomes 0. It is therefore necessary to modify the circuit configuration in order to control the frequency so that a circuit parameter other than the phase, e.g., attenuation, will reach a given value. Further, it is not possible to control the frequency to maximize or minimize the measured value of any circuit parameter.

A conventional frequency sweep system is shown in FIG. 3. Elements having functions similar to those in FIG. 4 are given like reference numbers. This is a method wherein a network analyzer 1 is used. A network analyzer can employ sophisticated calibration methods such as the full 2-port error correction method and 3-term error correction method (OPEN-SHORT-LOAD calibration method) which perform corrections by calibrating errors depending on the frequency of a transmission system, using three standards, i.e., open circuit, short circuit and reference impedance standards and, therefore, can perform measurements with higher accuracy than that of the frequency follow-up system. As to the full 2-port error correction method, refer to "Accuracy Enhancement Fundamentals—Characterizing Microwave Systematic Errors", HP 8753C Network Analyzer Operating Manual, Reference section Appendix 2, Chapter 5. As to the 3-term error correction method, refer to Japanese patent application No. H5-85545, and corresponding U.S. patent application Ser. No. 08/213,678, entitled "Electric Power Measuring Apparatus and Method", the disclosure of which is incorporated by reference.

A correction means 14 of a computer control portion 19 in the network analyzer 1 performs the full 2-port error correction or 3-term error correction on a value measured by a vector voltmeter 13 to obtain a corrected vector voltage value. A measured value data process 15 converts the corrected vector voltage value into desired data. e.g., the phase and the quantity of attenuation which are output on a screen or the like. The computer control portion 19 sends sweep frequency data 22 to a signal generator 2 through a frequency setting means 18 to cause a frequency sweep. The network analyzer 1 measures the phase of a signal from the device under test 7 and the direct-coupled cable 10 using vector voltmeter 13 to detect the resonance frequency. Although this system allows measurements with high accuracy, it takes time on the order of several hundred ms to measure the resonance frequency because a frequency sweep is performed. Therefore, it is not suitable for an application wherein the resonance frequency of an oscillator is adjusted while it is being measured. Each function in computer 19 is constituted by software.

According to the frequency sweep method, the frequency which provides an extreme measured value can be easily detected. However, like the detection of resonance frequency as described above, the detection takes time on the order of several hundred ms because frequency sweep is performed. This method is therefore not suitable for applications wherein an extreme value and the frequency associated therewith rapidly vary.

OBJECT OF THE INVENTION

It is an object of the present invention to provide a method for accurately and quickly measuring circuit parameters of a device whose frequency characteristics must be adjusted. As an example of the application thereof, there is provided a method for accurately and quickly measuring especially a quartz oscillator, the resonance frequency of which varies in a vacuum evaporation chamber, and for allowing simultaneous measurement on a quartz oscillator having a plurality of resonance modes.

SUMMARY OF THE INVENTION

In an embodiment of the present invention, a frequency follow-up function is added to a network analyzer which can perform measurement with high accuracy by eliminating influence of the frequency characteristics of a measuring system through calibration to provide a measuring apparatus capable of accurately and quickly measuring the frequency parameters of a device under test at high frequencies.

DESCRIPTION OF THE REFERENCE NUMBERS

Figure 1:
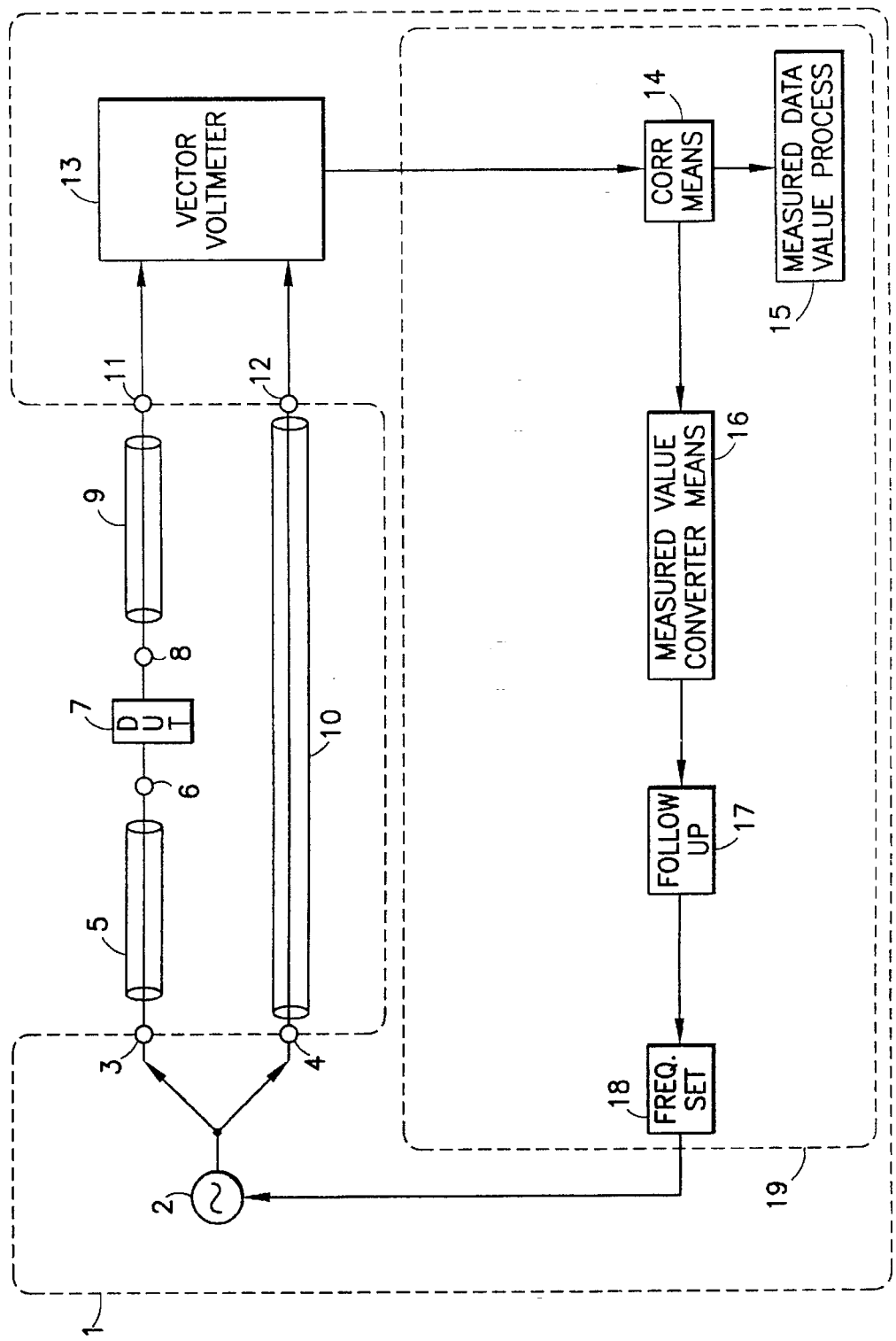
FIG. 1 shows an embodiment of a network analyzer of the present invention.

1: network analyzer
2: signal generator
3,4: connector
5: cable
6: connector
7: device under test
8: connector
9,10: cable
11,12: connector
13: vector voltmeter
14: correction means
15: measured value data process
16: measured value converting means
17: follow-up algorithm
18: frequency setting means
19: computer control portion
20,21: multiplexer
22: sweep frequency data
23: voltage controlled oscillator
24: frequency counter
25: phase detector
26: amplitude detector
27: computer control portion
28: filter
71: step 1 in the flow chart-starting
72: step 2 in the flow chart-initial setting
73: step 3 in the flow chart-fetching of measured value and calculation of error
74: step 4 in the flow chart-frequency calculation
75: step 5 in the flow chart-frequency setting
76: step 6 in the flow chart-preparation for calculation of next frequency

DETAILED DESCRIPTION OF THE INVENTION

Figure 3:
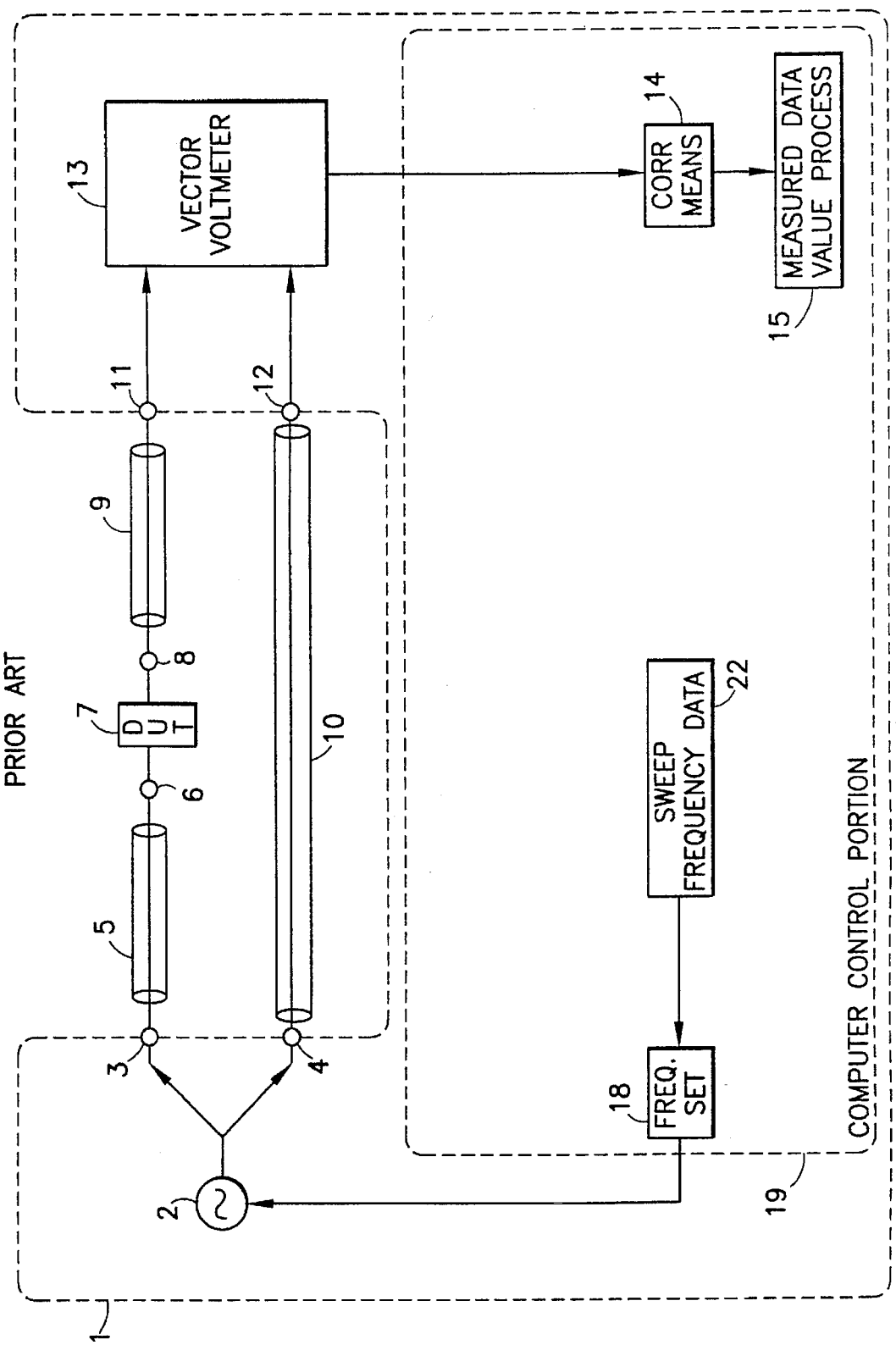
FIG. 3 shows a conventional measuring method carried out by a network analyzer.
Figure 4:
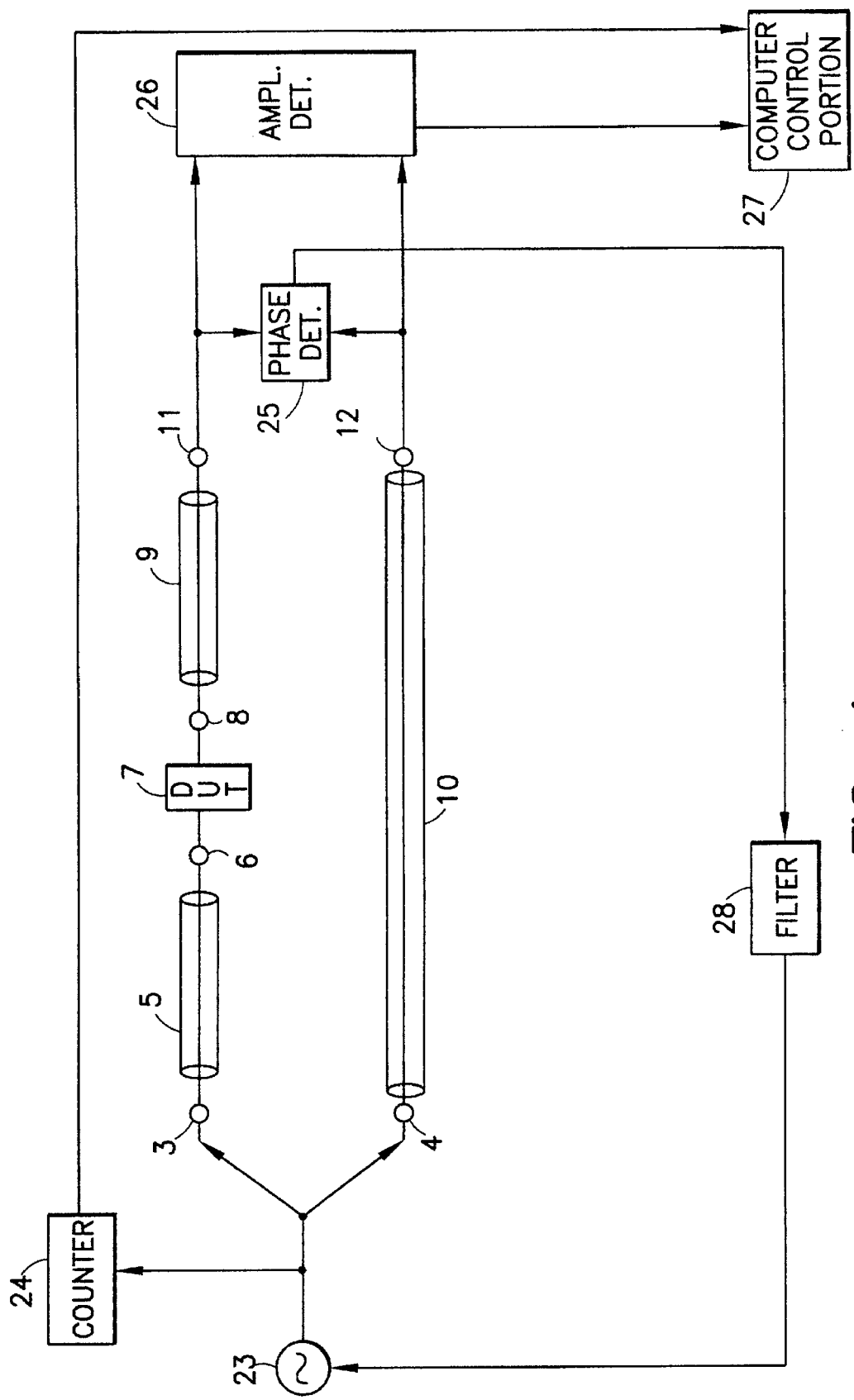
FIG. 4 shows a measuring method according to a transmission method of a conventional frequency follow-up system.

FIG. 1 shows an embodiment of the present invention. Elements having functions similar to those in FIG. 4 and FIG. 3 are given like reference numbers. The present invention is different from the example in FIG. 3 in that the network analyzer 1 constitutes a feedback loop for following up a resonance frequency. The feedback loop is realized by adding a measured value converting means 16 and a follow-up algorithm 17 to computer control portion 19. These additional functions are also constituted by software.

The measured value converting means 16 is a means to convert a corrected vector voltage measurement value into desired data. In the case of an application wherein a resonance frequency is followed up, the value is converted into a phase angle.

The follow-up algorithm 17 determines a next frequency from the result of the measurement of a phase angle received from the measured value converting means 16 (the algorithm will be described later) to control the output frequency of the signal generator 2 through a frequency setting means 18. Thus, the next frequency of the signal generator can be set to an optimum value from the result of the measurement, a target value and the like. As a result, the frequency can be followed up at high speed. Further, since the feedback loop includes a computer which controls the measurement frequency, the frequency characteristics of a transmission system at high frequencies can be corrected by a sophisticated correction method such as the full 2-port error correction. In addition, unlike the conventional network analyzer which performs measurements by means of sweeping, measurement is performed by following up a target measured value. It is therefore possible to measure changes in a resonance frequency over time substantially in real time.

Figure 2:
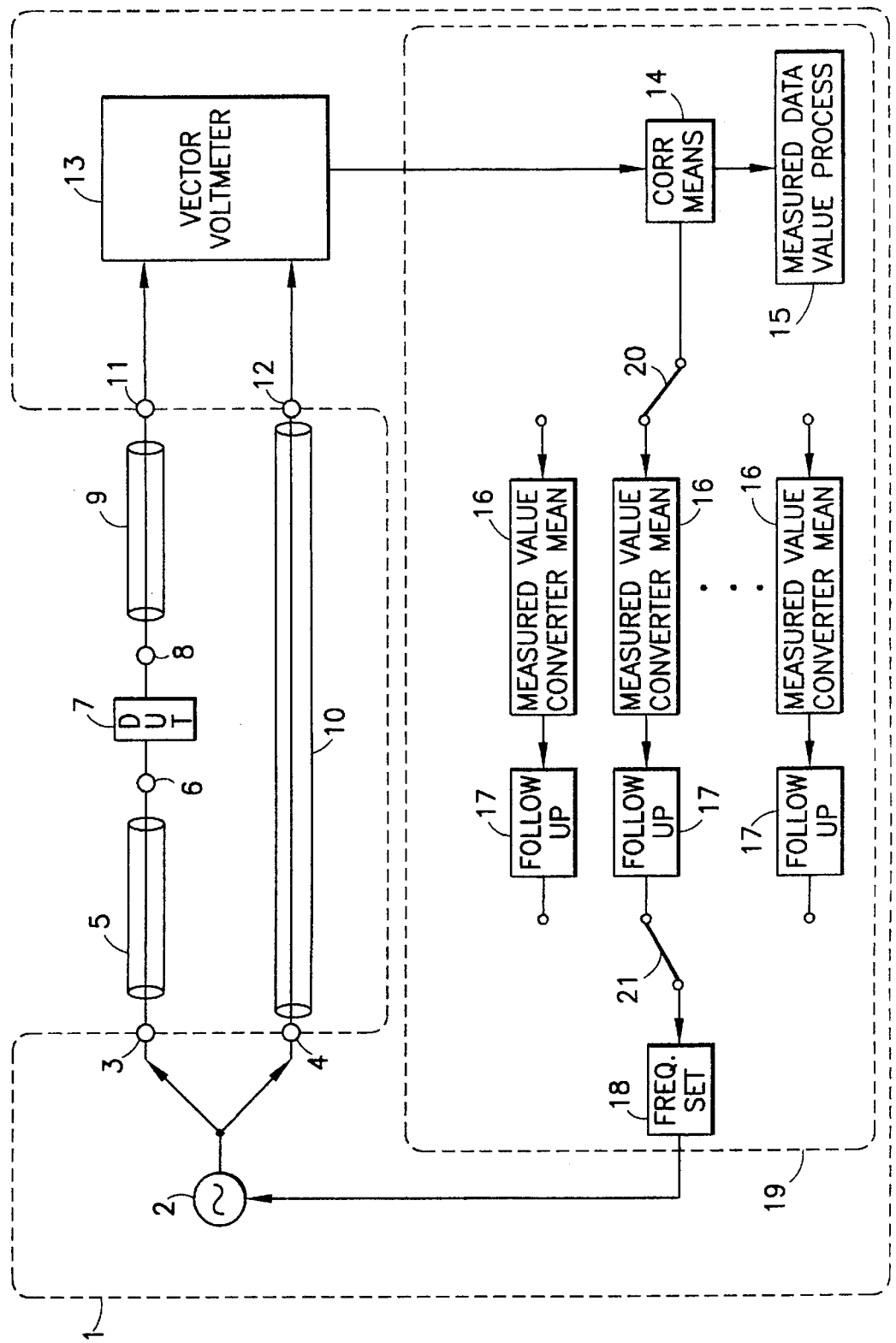
FIG. 2 shows a second embodiment of a network analyzer of the present invention.

FIG. 2 shows an embodiment wherein the resonance frequencies of a quartz oscillator having a plurality of resonance modes are simultaneously measured. Elements having functions similar to those in FIG. 1 are given like reference numbers. As shown in the figure, the computer control portion 19 has a plurality of measured value converting means 16 and follow-up algorithms 17 and switches them, using multiplexers 20 and 21 to follow up a plurality of target values on a time sharing basis. This makes it possible in measuring a quartz oscillator having two resonance modes, i.e., 0 deg and 180 deg to follow up each resonance frequency while measuring them alternately, thereby simultaneously measuring insertion losses and the like in the resonance frequencies. This application is not limited to quartz oscillators and can be extended to elements and filters including a resonance circuit.

Each function in the computer control portion is constituted by software.

Figure 5:
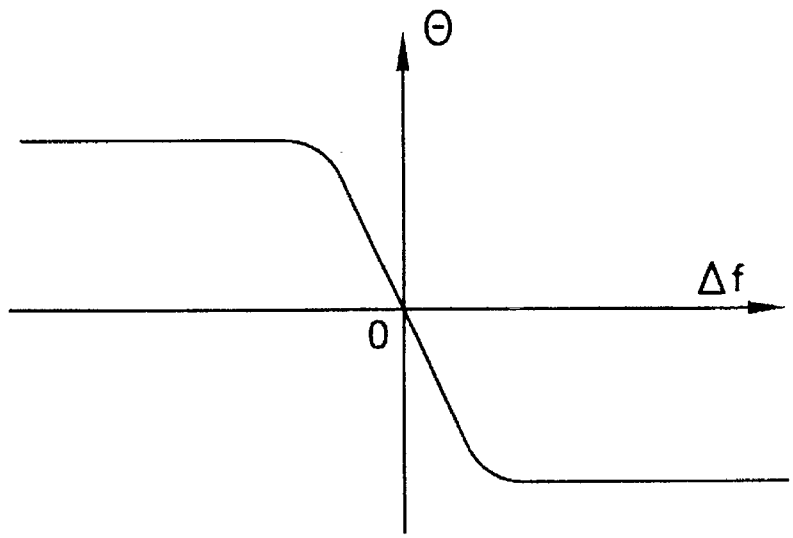
FIG. 5 shows phase-frequency characteristics of an oscillator near a resonance frequency thereof.

An embodiment of the follow-up algorithm will now be described. In general, an oscillator has the frequency-phase characteristic as shown in FIG. 5, and an oscillator can be considered linear when the vicinity of the resonance point is focused. Therefore, the relationship between the phase angle, the displacement from the resonance frequency and the linear gradient is expressed by the following equation where they are represented by $\theta$, $\Delta f$, and $H$, respectively.

$$\theta = H\Delta f$$

Figure 6:
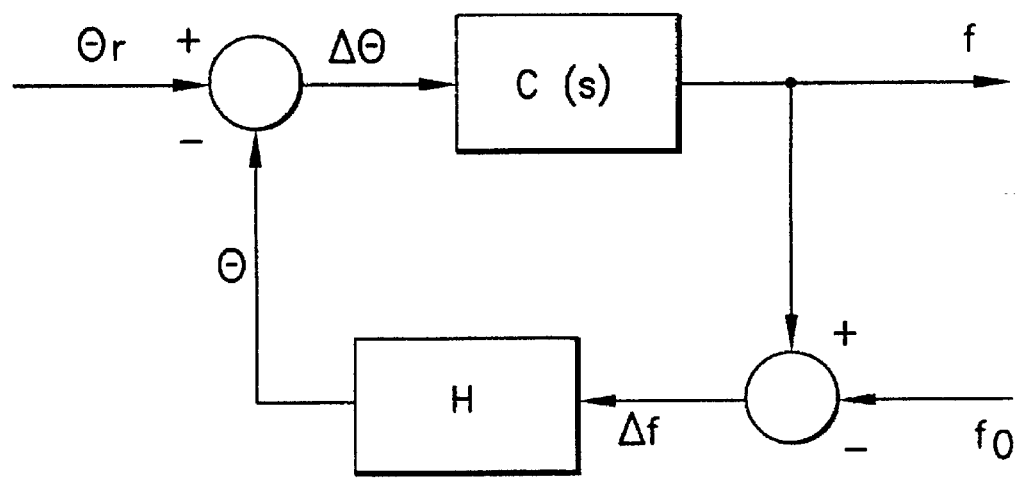
FIG. 6 shows a model of frequency follow-up control of the present invention.

The resonance frequency follow-up system is modelled as shown in FIG. 6. In the figure, $\theta$ represents the measured value of a phase angle; $\theta r$ represents the target phase angle of the follow-up system; $\Delta\theta = \theta r - \theta$; f represents a measurement frequency; $f_0$ represents the resonance frequency of an oscillator; $\Delta f = f - f_0$; H represents the gradient of the frequency-phase characteristic of the oscillator; and C(s) represents transfer functions of frequency control. Transfer functions from $\theta r$ to $\Delta\theta$ and from $f_0$ to $\Delta f$ are as follows.

$$\frac{\Delta\theta}{\theta r} = \frac{1}{1 + HC(s)} \tag{2}$$

$$\frac{\Delta f}{f_0} = -\frac{1}{1 + HC(s)} \tag{3}$$

A follow-up algorithm can be implemented by selecting C(s) so that $\Delta f = 0$ and $\Delta\theta = 0$ are finally satisfied for assumed inputs. The inputs are $\theta r$ and $f_0$. The input $\theta r$ is assumed to be added in the form of a step when the follow-up is started. It is assumed that the resonance point of the input $f_0$ is varied in the form of a ramp through adjustment. The transfer function C(s) for frequency control is expressed as follows using polynomials N(s) and D(s).

$$C(s) = \frac{N(s)}{D(s)} \tag{4}$$

where $N(s) = n_k s^k + n_{k-1} s^{k-1} + \ldots + n_2 s^2 + n_1 s + n_0$
$D(s) = d_k s^k + d_{k-1} s^{k-1} + \ldots + d_2 s^2 + d_1 s + d_0$ If Equation 4 is substituted in Equation 3:

$$\frac{D(s)}{D(s) + HN(s)} = \frac{d_k s^k + d_{k-1} s^{k-1} + \ldots + d_2 s^2 + d_1 s + d_0}{(d_k + Hn_k)s^k + \ldots + (d_1 + Hn_1)s + d_0 + Hn_0} \tag{5}$$

According to the final-value theorem, Equation 5 converges at 0 for the ramp input if the following equation is satisfied where T represents the gradient of the ramp.

$$\lim_{s \to 0} \frac{T}{s^2} \frac{d_k s^k + d_{k-1} s^{k-1} + \ldots + d_2 s^2 + d_1 s + d_0}{(d_k + Hn_k)s^k + \ldots + (d_1 + Hn_1)s + d_0 + Hn_0} = 0 \tag{6}$$

This equation is satisfied if $d_1 = d_0 = 0$. Therefore, the order of C(s) can be minimized and the following is derived.

$$C(s) = \frac{n_2 s^2 + n_1 s + n_0}{d_2 s^2} \tag{7}$$

This can be transformed into the following equation.

$$C(s) = Kc + \frac{1 + KcH}{H} \cdot \frac{2\zeta\omega s + \omega^2}{s^2} \tag{8}$$

$\zeta$ represents the damping coefficient of the system. $\omega$ represents the natural frequency. Kc represents a proportional compensation term (direct transfer term). If these are substituted in the transfer function in Equation 3:

$$\frac{1}{1 + HC(s)} = \frac{1}{1 + HKc} \cdot \frac{s^2}{s^2 + 2\zeta\omega s + \omega^2} \tag{9}$$

Thus, it is apparent from the final-value theorem that both the step and the ramp can be followed up. Equation 9 may be programmed and loaded in a computer as a follow-up algorithm to realize a network analyzer having a desired frequency follow-up function. Although a model of a continuous control system has been described, digitizing must be performed to implement this in the computer control portion. C(s) can be expressed as follows in state space representation.

$$\frac{dX}{dt} = AcX + Bc\Delta\theta \tag{10}$$

$$f = CcX + Dc\Delta\delta \tag{11}$$

where $$Ac = \begin{bmatrix} 0 & 1 \\ 0 & 0 \end{bmatrix} \quad Bc = \begin{bmatrix} 2\zeta \\ \omega \end{bmatrix}$$

$$Cc = \begin{bmatrix} \frac{1 + KcH}{H} \omega & 0 \end{bmatrix} \quad Dc = Kc$$

This is digitized as follows using sampling time Ts determined by the operation time of the computer where k represents the number for the digitizing.

$$X_{k+1} = AdX_k + Bd\Delta\theta_k \tag{12}$$

$$f_k = CdX_k + Dd\Delta\theta_k \tag{13}$$

where $$Ad = \begin{bmatrix} 1 & Ts \\ 0 & 1 \end{bmatrix} \quad Bd = \begin{bmatrix} (2\zeta + \omega Ts/2)Ts \\ \omega Ts \end{bmatrix}$$

$$Cd = \begin{bmatrix} \frac{1 + KcH}{H} \omega & 0 \end{bmatrix} \quad Dd = Kc$$

Figure 7:
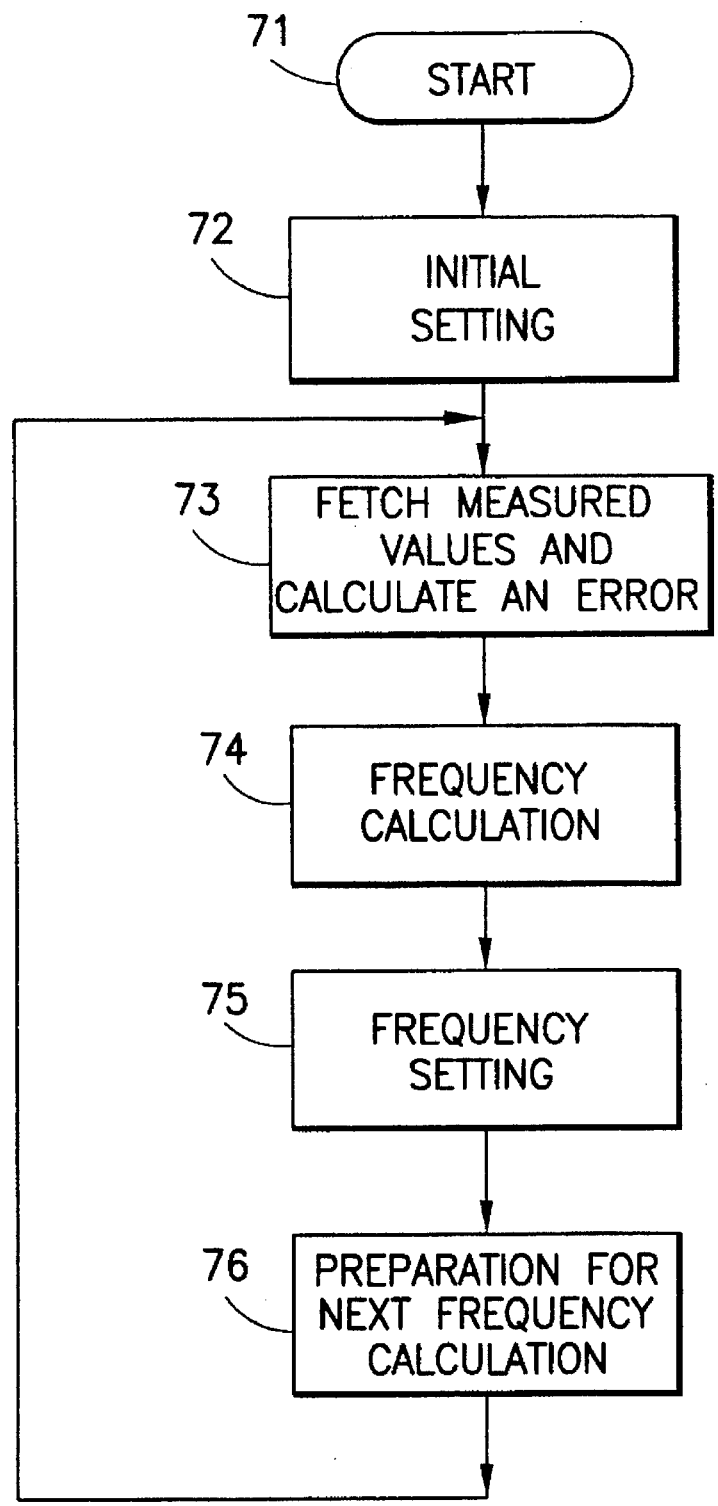
FIG. 7 is a flow chart of a frequency follow-up algorithm.

Equations 12 and 13 are a digitized frequency follow-up algorithm, an example of which embodied in a program is shown in the flow chart in FIG. 7. At step 71, the program is started and, at step 72, various initial settings such as a follow-up starting frequency are made. As the starting frequency, a value determined by a user of this measuring apparatus is read according to the characteristics of the device under test. At step 73, the measured value of a phase angle is fetched to calculate the error from the target value. Next, the output frequency of the signal generator 2 is calculated according to Equation 13 at step 74, and frequency setting data are sent to the frequency setting means 18 at step 75. At step 76, calculation is made according to Equation 12 to obtain the next frequency. The process now returns to step 73 to fetch the measured value of the phase angle again and the same process as the previous one is repeated to continue the frequency follow-up. Since the stoppage of the frequency follow-up is performed through an instruction external to this algorithm, it is omitted in the flow chart in FIG. 7.

Figure 8:
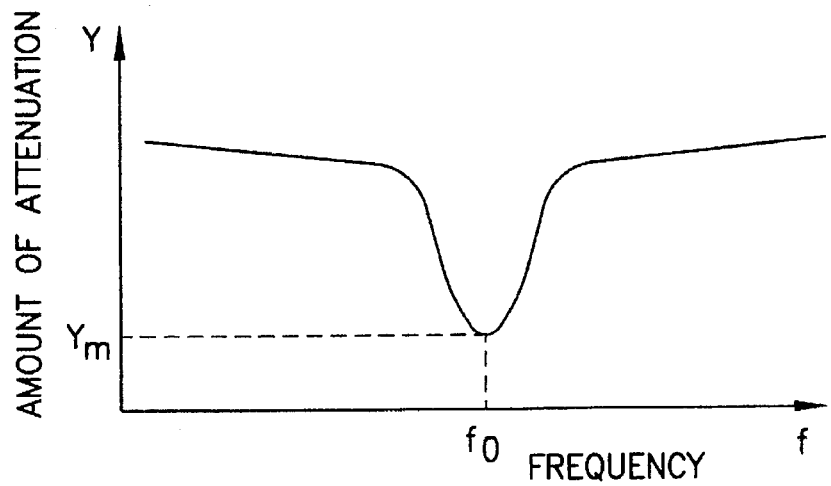
FIG. 8 shows an example of a frequency characteristic of a measured value having an extreme value.

An embodiment has been described wherein frequency follow-up is performed so that a measured value agrees with a given value (e.g., a phase angle of 0). A description will now be made on an embodiment wherein a measurement frequency is caused to follow-up the frequency which maximizes or minimizes the measured value (e.g., attenuation). Although a simple example involving one extreme value will be presented here, the same means as described below will work even in a case wherein a plurality of extreme values are involved if each individual extreme value is focused on. Assume that the attenuation of a device under test has a frequency characteristic as shown in FIG. 8 and that the extreme value ym (the minimum value in the figure) and the frequency $f_0$ thereof change with changes in the environmental conditions, adjustments at manufacturing steps, the level of a measurement signal and the like. The present invention allows frequency follow-up such that the measured value of attenuation becomes the value of the minimum attenuation even under such conditions. This algorithm will be described below. The same algorithm can be used for extreme values of circuit parameters other than attenuation.

Figure 9:
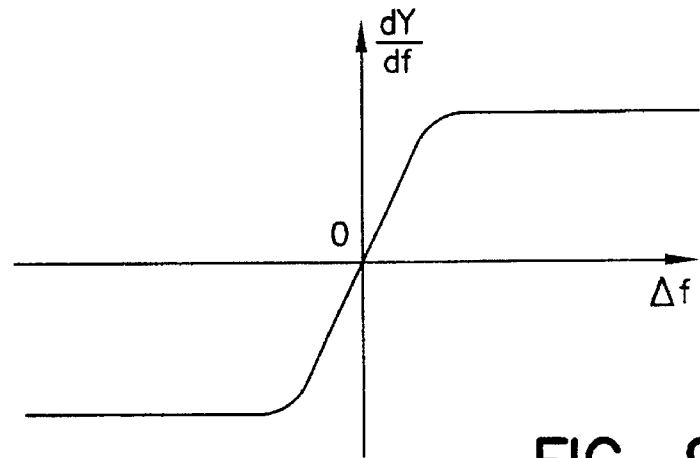
FIG. 9 is a diagram showing frequency-differentiated measured value having an extreme value.
Figure 10:
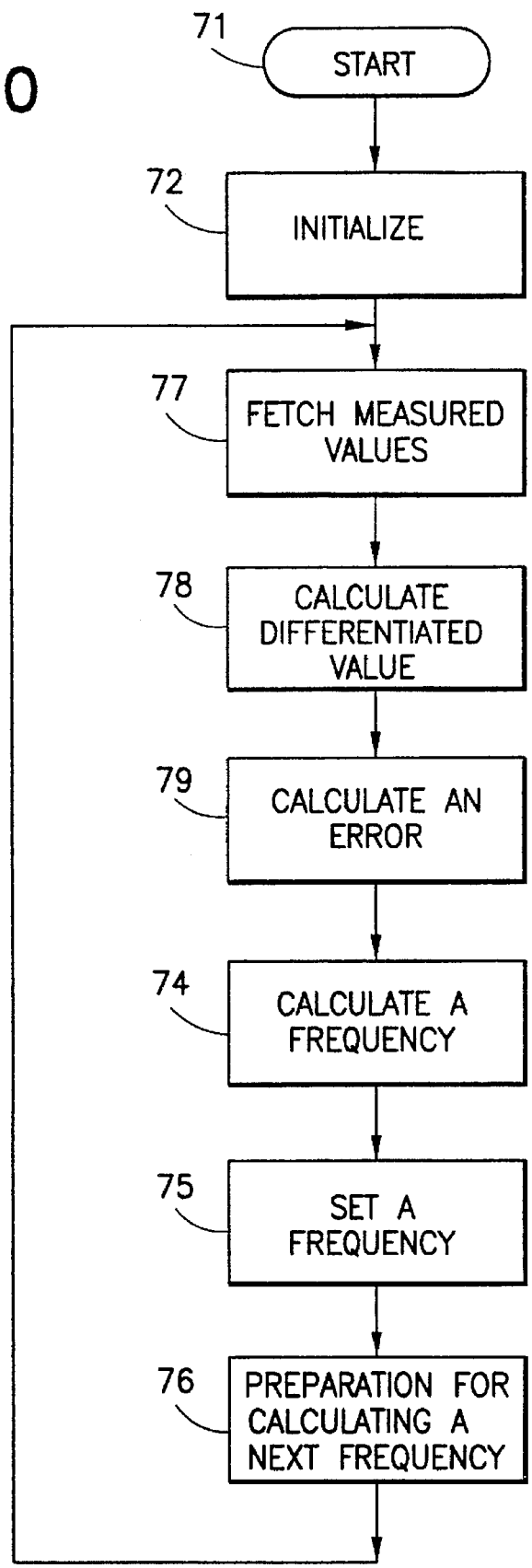
FIG. 10 is a flow chart for a second frequency follow-up algorithm according to the present invention.

Frequency-differentiation on FIG. 8 results in characteristics as shown in FIG. 9. Inversion of the polarity of the differentiated value results in characteristics similar to that shown in FIG. 5. Although not shown, the polarity of the differentiated value will be the same as that shown in FIG. 5 for the maximum value. Therefore, the minimum or maximum value can be followed up by differentiating the measured value of the attenuation with respect to frequency and by following the same algorithm as that for the follow-up to achieve a 0 phase angle as described above. This algorithm is illustrated by the flow chart in FIG. 10. The step 73 in FIG. 7 is replaced by steps 77, 78 and 79 in FIG. 10. At step 77, measurement is made at a plurality of frequencies to fetch measured values of the attenuation corresponding to FIG. 8. Step 78 calculates differentiated values and obtains the differentiated value-frequency characteristics of the measured value in the vicinity of the minimum or maximum value. The algorithm is the same as that for the follow-up to achieve a 0 phase angle as described above for the step 79 and later.

An embodiment of a method of obtaining the differentiated value of the attenuation at a frequency fs will now be described. This is a method wherein attenuation is first measured at a frequency apart from fs by a very small frequency fd to obtain a dummy differentiated value. Specifically, it is obtained using the following equation from measured values y (fs±fd) at two frequencies fs±fd.

$$\frac{dy}{df}\bigg|_{f=f_s} \approx \frac{y(fs+fd)-y(fs-fd)}{2fd} \qquad (14)$$

where y=attenuation

Figure 11:
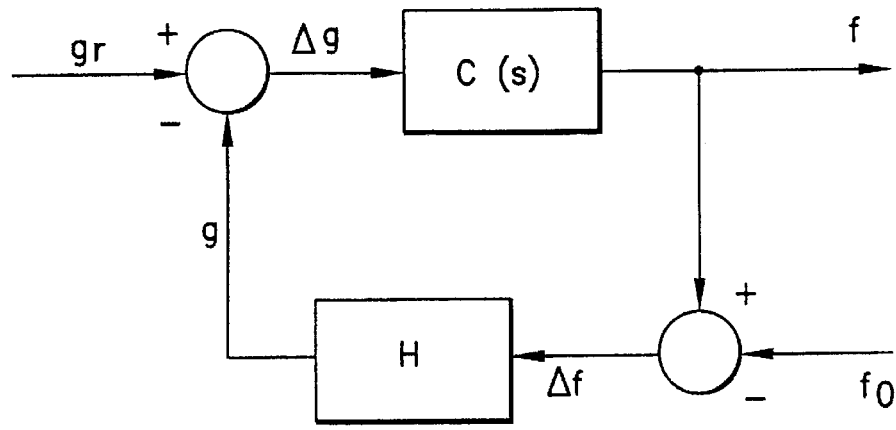
FIG. 11 shows the model of second frequency follow-up control according to the present invention.

The model of frequency follow-up control corresponding to FIG. 6 is shown in FIG. 11 wherein g represents a differentiated value of attenuation dy/df; gr represents a target value for follow-up which is 0 if the target is an extreme value; f represents a measurement frequency; $f_0$ represents a frequency which is an extreme value; and $\Delta f = f - f_0$.

The above-described method made it possible to quickly and accurately follow up a measured frequency so that the measured value equals the extreme value.

The model for designing of frequency follow-up and the follow-up algorithm which have been shown may be modified in various ways depending on the device under test. Since the algorithm is implemented in software according to the present invention, there is an advantage that such modifications can be flexibly made.

The apparatus and method for measuring according to the present invention can be applied to measurements of a device under test which is subjected to changes in the environment such as temperature, humidity and time and changes in the level of an applied measurement signal.

For example, changes in the resonance frequency or the frequency resulting in the minimum attenuation in response to the changes in the signal level can be measured by sweeping the level of the measurement signal over a desired range to cause the measurement frequency to follow up the changes in the resonance frequency or the frequency resulting in the minimum attenuation. Changes in the resonance frequency in response to temperature changes can be measured by varying the temperature over a desired range with the device under test placed in a test chamber such as a thermostatic chamber.

Effects of the Invention

Implementation of the present invention has provided a network analyzer with frequency follow-up and measurement functions to allow highly accurate and quick measurement even at high frequencies. Since the feedback loop is constituted by software, it is possible to simply perform highly flexible measurement which can satisfy various follow-up requirements.

The types and the like of the constituent devices illustrated should not be taken in a limiting sense, and modifications in configuration are possible as desired without departing from the principle of the present invention.

I claim:

1. A circuit network measuring apparatus for applying a measurement signal from a signal source to a device under test (DUT) and to a reference path, signals from said DUT and said reference path being applied as first and second inputs to vector voltmeter means which provides an output indicative of a difference between said first and second inputs, said circuit network measuring apparatus including a software-controlled computer, and further comprising:

measured value converting means responsive to a vector voltage measurement value from said vector voltmeter means for outputting a phase angle value;

follow-up means responsive to said phase angle value for determining a frequency value from said phase angle; and means responsive to said frequency value for outputting a frequency control signal to said signal source to cause a change in frequency output thereof in a direction which reduces said difference between said first and second inputs applied to said vector voltmeter.

2. The circuit measuring apparatus as recited in claim 1, wherein said DUT is a quartz oscillator and the output frequency of said signal source is varied so that a phase lag of said quartz oscillator reaches a predetermined value and causes said output frequency to follow a resonance frequency of said oscillator.

3. The circuit network measuring apparatus as recited in claim 1, wherein said software controlled computer includes means for correcting frequency characteristics of the circuit network measuring apparatus in accordance with open circuit, short circuit and reference impedance procedures.

4. A circuit network measuring apparatus for applying a measurement signal from a signal source to a device under test (DUT) and to a reference path, signals from said DUT and said reference path being applied as first and second inputs to voltmeter means which provides an output indicative of an attenuation amount between said first and second inputs, said circuit network measuring apparatus including a software-controlled computer, and further comprising:

measured value converting means responsive to a voltage measurement value from said voltmeter means for outputting a differential value of attenuation with respect to frequency;

follow-up means responsive to said differential value for determining a frequency value from said differential value; and means responsive to said frequency value for outputting a frequency control signal to said signal source to cause a change in frequency output thereof in a direction to cause said differential value to reach a predetermined value.

5. The circuit measuring apparatus as recited in claim 4, wherein said DUT is a quartz oscillator and the output frequency of said signal source is varied so that said differential value of attenuation of said quartz oscillator reaches a predetermined value and causes said output frequency to follow an extreme value of the attenuation of said oscillator.

6. The circuit network measuring apparatus as recited in claim 4, wherein said software controlled computer includes means for correcting frequency characteristics of the circuit network measuring apparatus in accordance with open circuit, short circuit and reference impedance procedures.

* * * * *